United States Patent
Van Bommel et al.

(10) Patent No.: US 12,129,415 B2
(45) Date of Patent: Oct. 29, 2024

(54) LUMINESCENT CONVERTER FOR A PHOSPHOR ENHANCED LIGHT SOURCE

(75) Inventors: Ties Van Bommel, Horst (NL); Rifat Ata Mustafa Hikmet, Eindhoven (NL); Jan Cornelis Kriege, Mierlo (NL)

(73) Assignee: SIGNIFY HOLDING, B.V., Eindhoven (NL)

(*) Notice: Subject to any disclaimer, the term of this patent is extended or adjusted under 35 U.S.C. 154(b) by 725 days.

(21) Appl. No.: 14/009,865

(22) PCT Filed: Apr. 3, 2012

(86) PCT No.: PCT/IB2012/051621
§ 371 (c)(1),
(2), (4) Date: Oct. 4, 2013

(87) PCT Pub. No.: WO2012/140542
PCT Pub. Date: Oct. 18, 2012

(65) Prior Publication Data
US 2014/0021857 A1 Jan. 23, 2014

(30) Foreign Application Priority Data
Apr. 12, 2011 (EP) .................... 11162040

(51) Int. Cl.
*C09K 11/06* (2006.01)
*C09K 11/77* (2006.01)
(Continued)

(52) U.S. Cl.
CPC .......... *C09K 11/06* (2013.01); *C09K 11/7774* (2013.01); *H01L 33/504* (2013.01);
(Continued)

(58) Field of Classification Search
CPC .................................................. C09K 11/06
See application file for complete search history.

(56) References Cited

U.S. PATENT DOCUMENTS 7,078,732 B1 7/2006 Reeh et al.
7,446,198 B2 * 11/2008 Boehm ............... C07D 221/18
106/498

(Continued)

FOREIGN PATENT DOCUMENTS

CN 1228873 A 9/1999
JP 2006313817 A 11/2006
(Continued)

OTHER PUBLICATIONS

Technical Specification for Lumogen F Red 300.*
Technical Information for Lumogen F, BASF, Nov. 1997.*

*Primary Examiner* — Alex A Rolland

(57) ABSTRACT

A luminescent converter 200, 220, 240, 260, a phosphor-enhanced light source and a luminaire are provided. The luminescent converter 200 comprises a first organic luminescent material 202, a second organic luminescent material 208 and a third inorganic luminescent material 206. The first organic luminescent material 202, the second organic luminescent material 208 and the inorganic luminescent material 206 absorb a portion of light emitted by the light source and/or absorbs a portion of light emitted by at least one of the other luminescent materials. The first organic luminescent material 202 converts at least a part of the absorbed light into light of a first color distribution. The second organic luminescent material 208 converts at least a part of the absorbed light into light of a second color distribution. The inorganic luminescent material 206 converts at least a part of the absorbed light into a third color distribution to compensate self-absorption of light by at least one of the first organic luminescent material 202 and the second organic luminescent material 208.

12 Claims, 5 Drawing Sheets

(51) Int. Cl.
*H01L 33/50* (2010.01)
*H05B 33/12* (2006.01)

(52) U.S. Cl.
CPC ...... *H05B 33/12* (2013.01); *C09K 2211/1011* (2013.01); *C09K 2211/1029* (2013.01); *C09K 2211/1044* (2013.01)

(56) References Cited

U.S. PATENT DOCUMENTS

| | | |
|---|---|---|
| 2002/0176259 A1 | 11/2002 | Ducharme |
| 2006/0065907 A1* | 3/2006 | Lee .................. C09K 11/06 257/100 |
| 2006/0220531 A1 | 10/2006 | Tokunaga et al. |
| 2009/0167151 A1 | 7/2009 | Kolodin et al. |
| 2011/0068328 A1 | 3/2011 | Koenemann et al. |

FOREIGN PATENT DOCUMENTS

| | | | |
|---|---|---|---|
| WO | WO 2004036961 A2 * | 4/2004 | ............. C09K 11/06 |
| WO | 2010116294 A1 | 10/2010 | |

* cited by examiner

300

350

LUMINESCENT CONVERTER FOR A PHOSPHOR ENHANCED LIGHT SOURCE

FIELD OF THE INVENTION

The invention relates to luminescent product for converting light of a first color distribution to light of another color distribution.

BACKGROUND OF THE INVENTION

In many applications luminescent material is combined with a solid state light emitter to generate a light emission distribution which is experienced by users as white light. The color rendering index of the light emission distribution of the generated white light should be relatively high to have a good color rending index.

It is known to combine different inorganic luminescent materials that each emits light of a different color together with a solid state light emitter which emits light of a single color. Inorganic luminescent materials are stable and may be used at a relatively high temperature. However, inorganic luminescent materials are relatively expensive.

In order to reduce costs, in some applications so-termed remote organic phosphors are used, which are mixes of organic luminescent materials and which are placed at a certain distance from the solid state light emitter. However, a limited set of stable organic luminescent materials are available such that it is difficult to manufacture a light source which has a large enough light emission at every color. Thus, it is difficult to create light sources comprising a mix of organic luminescent material which have a high color rendering index.

SUMMARY OF THE INVENTION

It is an object of the invention to provide a luminescent converter for a phosphor-enhanced light source having a high color rendering index.

A first aspect of the invention provides a luminescent converter as claimed in claim 1. A second aspect of the invention provides a phosphor-enhanced light source. The third aspect of the invention provides a luminaire. Advantageous embodiments are defined in the dependent claims.

A luminescent converter for a phosphor-enhanced light source which comprises a light source in accordance with the first aspect of the invention comprises a first organic luminescent material, a second organic luminescent material and a third inorganic luminescent material. The first organic luminescent material absorbs a first portion of light emitted by the light source and/or absorbs a portion of light emitted by at least one of the second organic luminescent material or the inorganic luminescent material. The first organic luminescent material converts at least a part of the absorbed light into light of a first color distribution. The second organic luminescent material absorbs a second portion of the light emitted by the light source and/or absorbs a portion of light emitted by at least one of the first organic luminescent material or the inorganic luminescent material. The second organic luminescent material converts at least a part of the absorbed light into light of a second color distribution. The inorganic luminescent material absorbs a third portion of the light emitted by the light source and/or absorbs a portion of light emitted by the first organic luminescent material or the second organic luminescent material. The inorganic luminescent material converts at least a part of the absorbed light into a third color distribution to compensate self-absorption of light by at least one of the first organic luminescent material and the second organic luminescent material.

The light which is received by the luminescent converter is partly absorbed and is partly emitted through the luminescent converter. The first organic luminescent material is excited by the light of the light source or by light that is emitted by another luminescent material and emits light of the first color distribution. The second luminescent material is excited by the light of the light source or by light that is emitted by another luminescent material and emits light of the second color distribution. Thus, a light distribution is emitted by the luminescent converter comprises at least light that directly originates from the light source, and light of the first color distribution and of the second color distribution. If the specific amounts of organic luminescent material are chosen, white light may be emitted by the luminescent converter. However, as discussed previously, it is difficult to create light which has a relatively high color rending index (CRI), for example, larger than 80. Thus, the skilled person would not use two organic luminescent materials when he has to obtain a relatively high color rending index.

It is the insight of the inventors that creating a light emission with a high CRI is especially difficult because of so-termed 'self-absorption' of light by one of the organic luminescent materials. A light source that is often used in phosphor-enhanced light sources is a blue emitting light emitting solid state light emitter. Many known organic luminescent materials, do not absorb blue strongly. Consequently, a relatively large amount of the specific organic luminescent material must be used to be able to convert enough blue light to light of the first or second color distribution. If such a large amount of this material is used, a part of the light at the lower end of the first or second color distribution that is emitted by the first or second organic luminescent material is absorbed by the first or second organic luminescent material itself. This phenomenon is caused by an overlap of the light emission spectrum of the specific organic luminescent material with the light absorption spectrum of the specific organic luminescent material. In other words, a specific luminescent material subject to self-absorption absorbs a portion of the light that is emitted by the specific luminescent material itself.

Due to the self-absorption of the light, a light emission spectrum of relatively large amount of the first or second luminescent material obtains a dip at the lower wavelengths of the emission spectrum and consequently the mean wavelength of the first or second color distribution shifts slightly towards a higher wavelength (towards red). As a consequence, the light emission spectrum of the luminescent converter which comprises the first and second organic luminescent material lacks light in a specific spectral range which keeps the color rending index below a certain value, for example, below 80.

The inventors have found that the effect of self-absorption may be compensated by adding a third luminescent material which is inorganic and which emits a third color distribution that compensates the self-absorption by the first and/or the second luminescent material. As such it is possible to create a luminescent converter which emits a light distribution having light in almost all color ranges and, thus, having a high color rendering index. A further advantage of the use of inorganic luminescent material is that this material is a stable material. Further, the luminescent converter is relatively cheap because of the small amount of inorganic phosphors.

In this context, each luminescent material emits light of a specific color distribution. The specific color distribution may, for example, comprise a primary color having a specific bandwidth around a predefined wavelength, or may, for example, comprise a plurality of primary colors. The predefined wavelength is a mean wavelength of a radiant power spectral distribution. The light of a primary color, for example, includes Red, Green, Blue, Yellow and Amber light. The specific color distribution may also comprise mixtures of a plurality of colors, such as the neighboring colors Green and Yellow.

According to a further embodiment, the first color distribution comprises red light. The second organic luminescent material is configured for only absorbing a portion of the light emitted by the light source and/or absorbing a portion of light by the inorganic luminescent material and the second color distribution comprises yellow light. The inorganic luminescent material is configured for only absorbing light the third portion of the light emitted by the light source, and the third color distribution comprises light in the spectral range from 490 nm to 560 nm. In the specific combination of this embodiment, the yellow-emitting second organic luminescent material is subject to a relatively high amount of self-absorption which results in lack of green light in the light emission spectrum of a luminescent converter which only comprises the organic luminescent materials. This is compensated by the inorganic luminescent material of the embodiment.

Further, in general, luminescent materials only absorb light of a lower wavelength than the light that is emitted by specific luminescent material. Therefore the inorganic luminescent material can only absorb light of the light source, and the second organic luminescent material only absorbs light that is emitted by the light source and/or light that is emitted by the inorganic luminescent material.

According to an embodiment, the first organic luminescent material and second organic luminescent material are a stable organic luminescent material. The stable luminescent material is defined as a material which shows less than 10% decrease in luminescence in 100 hours under at least one of the following test condition. Luminescent material is molecularly dissolved in a polymer matrix such as polymethylmethacrylate (PMMA), polyethylene terephthalate (PET) or poly carbonate (PC) and the concentration is adjusted so that at a thickness of 200 micrometer the layer containing the luminescent molecules shows 10% absorption at 450 nm. The layer is then placed in a thermo stated chamber and continuously irradiated using a laser emitting at 450 nm. The atmosphere in the chamber housing the polymer layer may be: pure nitrogen, air or a mixture of pure nitrogen containing 0.1% oxygen.

In an embodiment the second organic material is a compound according to formula (I) or (II):

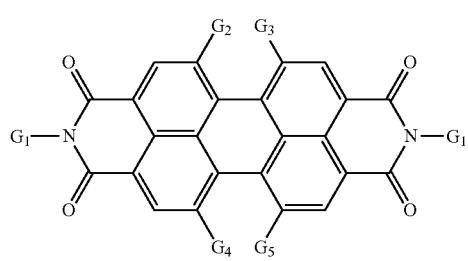

(I)

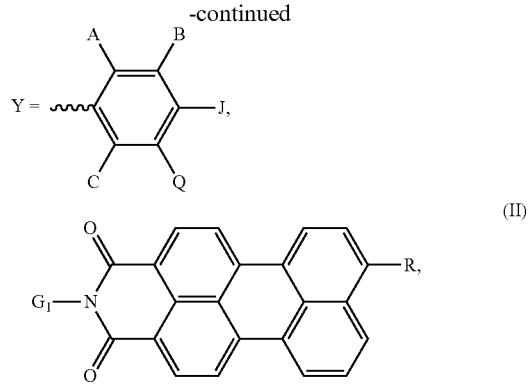

(II)

wherein

G$_1$ is a linear or branched alkyl group or oxygen-containing alkyl group C$_n$H$_{2n-1}$O$_n$, n being an integer from 1 to 44 and m<n/2, or G$_1$ is Y;

each of A, B, C, J and Q independently is hydrogen, isopropyl, t-butyl, fluorine, methoxy, or unsubstituted saturated alkyl C$_n$H$_{2n+1}$, n being an integer from 1 to 16;

at least two of G$_2$, G$_3$, G$_4$ and G$_5$ is fluorine, while the remaining of G$_2$, G$_3$, G$_4$ and G$_5$ are independently hydrogen, methoxy, or unsubstituted saturated alkyl group C$_n$H$_{2n+1}$, n being an integer from 1 to 16, R is a linear or branched alkyl group or oxygen-containing alkyl group C$_n$H$_{2n-1}$O$_n$, n being an integer from 1 to 44 and m<n/2, or R is hydrogen, isopropyl, t-butyl, fluorine, methoxy or cyano, each of A, B, C, J and Q independently is hydrogen, isopropyl, t-butyl, fluorine, methoxy, cyano or unsubstituted saturated alkyl C$_n$H$_{2n+1}$, n being an integer from 1 to 16.

Some known yellow-emitting organic luminescent materials have a low stability when irradiated with blue light. The inventors have found the above indicated class of organic luminescent materials that emit yellow light and have a high stability when irradiated with blue light. However, these materials have a relatively low absorbance of blue light and as such the effect of 'self-absorption' is more significantly present if the materials of this class are used. Thus, the addition of the inorganic luminescent material is important to obtain a light emission spectrum that has a relatively high color rendering index.

In an embodiment, the second organic luminescent material comprising a perylene monoamide compound according to formula (III) or (IV):

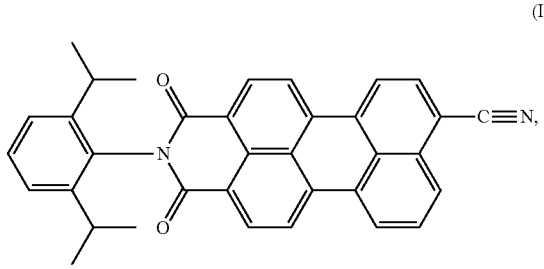

(III)

-continued

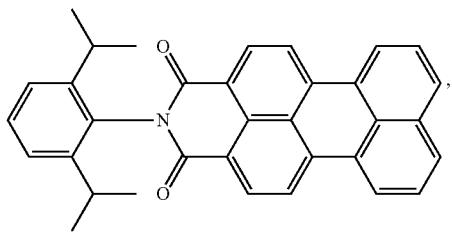

(IV)

or the second organic luminescent material comprising a fluorine substituted perylene bisamide compound according to formula (V) or (VI):

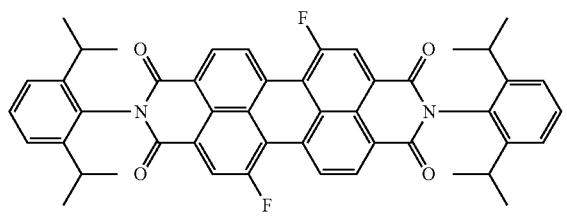

(V)

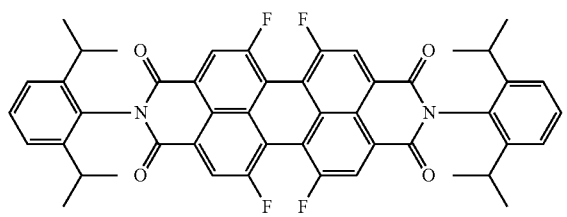

(VI)

The compounds of the embodiment are stable organic luminescent materials and as such very suitable for use in a phosphor-enhanced light source and they are able to convert light in the blue spectral range towards light in the yellow spectral range.

In an embodiment, at least one of the first organic luminescent material and the second organic luminescent material is a perylene derivative. Perylene derivatives have advantageous luminescent characteristics and a wide range of materials may be created each having different absorption/excitation spectra and emission spectra.

In another embodiment, the inorganic luminescent material comprises at least one of: YAG:Ce or LuAG:Ce.

In an embodiment, the luminescent converter comprises a layer comprising a mix of the first organic luminescent material, the second luminescent material, and the inorganic luminescent material. Manufacturing the luminescent converter which comprises the mix of luminescent material is relatively easy and, thus, relatively cheap. The materials have to be mixed only once and in one step the mix may be arranged in the phosphor-enhanced light source. The mix of luminescent material is often mixed with a matrix polymer to obtain a mix of material that can easily be applied in phosphor-enhanced light sources. The matrix polymer is a polymer in which the luminescent material is dispersed or molecularly dissolved. The polymer matrix may be chosen amongst polymers such as acrylates (for example polymethylmethacrylate), polycarbonate, polystyrene, polyethylene, polyethylene terepthalate, polyethylene naphtalate and their copolymers and blends.

Furthermore, the inorganic luminescent material may function as scattering material in the mixture of luminescent materials. Often, luminescent material is applied in a layer of material. In such a layer light is often captured, for example, via internal reflection. Part of this captured light is often re-absorbed and thus lost which reduces the conversion efficiency of the luminescent converter. To prevent the light to be captured inside a layer, additional scattering material may be added to the luminescent layer. However, also scattering material represents some kind of light loss which is not preferred. By mixing the inorganic luminescent material being the first luminescent material with the organic luminescent material being the second luminescent material in a single mix of luminescent materials, the inorganic luminescent material may act as scattering material improving the extraction of light generated inside the luminescent material. A further benefit when using a mixture of luminescent materials is that the appearance of the phosphor-enhanced light source is determined by the mixture of the luminescent materials rather than the appearance of the upper luminescent material as would be the case in a stacked configuration. This would generate a more natural appearance of the phosphor-enhanced light source which would reduce consumer confusion.

In another embodiment, the luminescent converter comprises a stack of at least three layers, wherein each layer comprises a single one luminescent material of the group of: the first organic luminescent material, the second luminescent material, and the inorganic luminescent material. Although manufacturing the stack of layers which each comprises another luminescent material is more complex than manufacturing a single layer, additional design freedom is created such to obtain a phosphor enhanced light source which exactly emits light according to a predefined light emission distribution. It is, for example, possible that a specific luminescent material is, in addition to being excited by light of the light source, also excited by light emitted by another luminescent material. It may be advantageous to put the specific luminescent materials as the first layer to prevent the absorption of the light generated by the another luminescent material. However, in other embodiments, depending on the specific characteristics of the predefined light emission distribution, it may be advantageous to apply the layer with the specific luminescent material in between the other layers.

Further, the layered structure provides the benefit that the different layers with luminescent materials may be generated via a production process which is best suited for the specific luminescent material. For example, organic luminescent materials are often soluble to generate a liquid having a specific viscosity. Such a liquid may, for example, be easily applied on a carrier material in a substantially uniform layer via well known spin-coat techniques. The inorganic luminescent material may not be soluble and as such the layer of first luminescent material may be generated via other techniques suitable for the chosen first luminescent material.

In an embodiment, the luminescent converter comprises a layer which locally comprises a first sub-area and a second sub-area. The first sub-area comprises a first material of the group of: the first organic luminescent material, the second luminescent material, and the inorganic luminescent material. The second sub-area comprises a second material of the group of: the first organic luminescent material, the second luminescent material, and the inorganic luminescent material. The second material is different from the first material. The first sub-area does not comprise the second material and the second sub-area does not comprise the first material.

Further, the layer may comprise other materials, like a matrix polymer. However, the layer comprises sub-areas with a single luminescent material and sub-areas with another single luminescent material. Thus, the layer comprises a pattern of different luminescent materials. By patterning the luminescent material in the layer, an additional design parameter is obtained for optimizing the emitted color distribution by the phosphor-enhanced light source. The patterning may be performed by printing or coating a mixture of a matrix polymer with a specific luminescent material at specific positions and printing another mixture of the matrix polymer and another luminescent material at the areas in between the initially printed mixture. With a patterned luminescent layer it is prevented that light emitted by a specific luminescent material is absorbed by another specific luminescent. The patterning results in a spatial separation of the different luminescent materials and thereby the influence that they have on each other's light emission spectrum is reduced, which is specifically important if light of a specific color may not be absorbed by a luminescent material to obtain a high enough color rending index.

In another embodiment, the luminescent converter comprises a further layer comprising a third material of the group of: the first organic luminescent material, the second luminescent material, and the inorganic luminescent material, the third material being different from the first material and from the second material.

In a further embodiment, the layer comprises a third sub-area which comprises a third material of the group of: the first organic luminescent material, the second luminescent material, and the inorganic luminescent material. The third material is different from the first material and is different from the second material. The third sub-area does not comprise the first material and does not comprise the second material. The first sub-area and the second sub-area do not comprise the third material.

The layer with the three luminescent materials which are separated in space may be manufactured on a substrate, for example, a glass substrate.

In an embodiment, the luminescent converter comprises scattering particles. The scattering particles may comprise, for example, $Al_2O_3$ and $TiO_2$. Scattering particles may assist in obtaining a more diffuse and more uniform light emission by the luminescent converter. Often, luminescent material is applied in a layer of material. In such a layer light is often captured, for example, via internal reflection. Part of this captured light is often re-absorbed and thus lost which reduces the conversion efficiency of the luminescent converter. To prevent the light to be captured inside a layer, additional scattering material may be added to the luminescent layer.

According to a second aspect of the invention, a phosphor-enhanced light source is provided which comprises a light source and a luminescent converter according to the first aspect of the invention.

The phosphor-enhanced light source according to the second aspect of the invention provides the same benefits as the luminescent converter according to the first aspect of the invention and has similar embodiments with similar effects as the corresponding embodiments of the luminescent converter.

The light source may be a solid state light emitter, such as a light emitting diode, a laser diode or an organic light emitting diode.

In an embodiment, the light source emits blue light. Light sources which emit in the blue spectral range are in general available as high power light sources and have a long lifetime. Further, several advantageous luminescent materials are available to convert the blue light towards yellow light, which is the light emitted by the first organic luminescent material, towards red light, which is the light emitted by the second organic luminescent material, and towards light in the spectral range of 490 to 560 nm, which is the light emitted by the inorganic luminescent material.

In an embodiment, a gap is present between the light source and the luminescent converter. The gap prevents the direct conduction of heat from the light source towards the luminescent converter thereby preventing deterioration of the luminescent material because of overheating. Often the term "remote phosphor configuration" is used to indicate that there is a certain distance between the luminescent converter and the light source.

In another embodiment, the phosphor-enhanced light source has a light emission of which the color rendering index is larger than 75. In a further embodiment, the color rendering index is larger than 80.

The light emission distribution of the phosphor-enhanced light source is a weighted sum of the first color distribution, the second color distribution, the third color distribution, and the remaining light of the light source. Therefore, the total light emission by the phosphor-enhanced has light in every color range and has a relatively high color rending index.

According to a third aspect of the invention, a luminaire is provided which comprises the luminescent converter according to the first aspect of the invention or comprises the phosphor-enhanced light source according to the second aspect of the invention.

The luminaire according to the third aspect of the invention provides the same benefits as the luminescent converter according to the first aspect of the invention or the phosphor-enhanced light source according to the second aspect of the invention and has similar embodiments with similar effects as the corresponding embodiments of the luminescent converter or of the phosphor-enhanced light source.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Modifications and variations of the luminescent converter, the phosphor-enhanced light source and the luminaire, which correspond to the described modifications and variations of the luminescent product, can be carried out by a person skilled in the art on the basis of the present description.

Figure 1A:
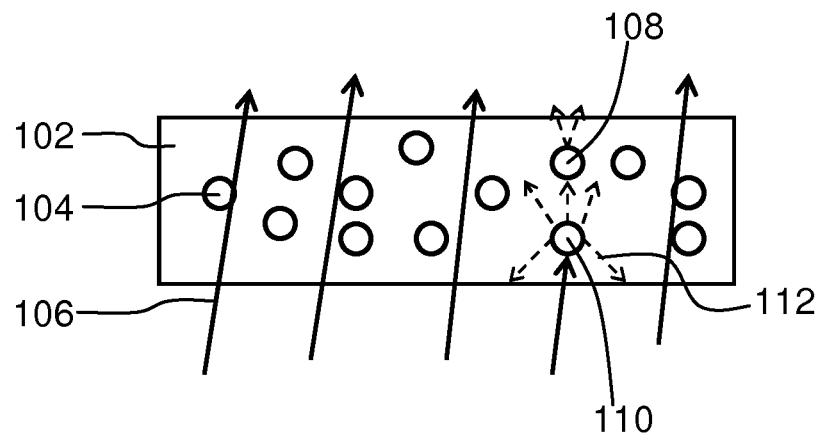
FIG. 1a schematically shows self-absorption by a luminescent material.

It should be noted that items denoted by the same reference numerals in different Figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly.

DETAILED DESCRIPTION

Figure 1B:
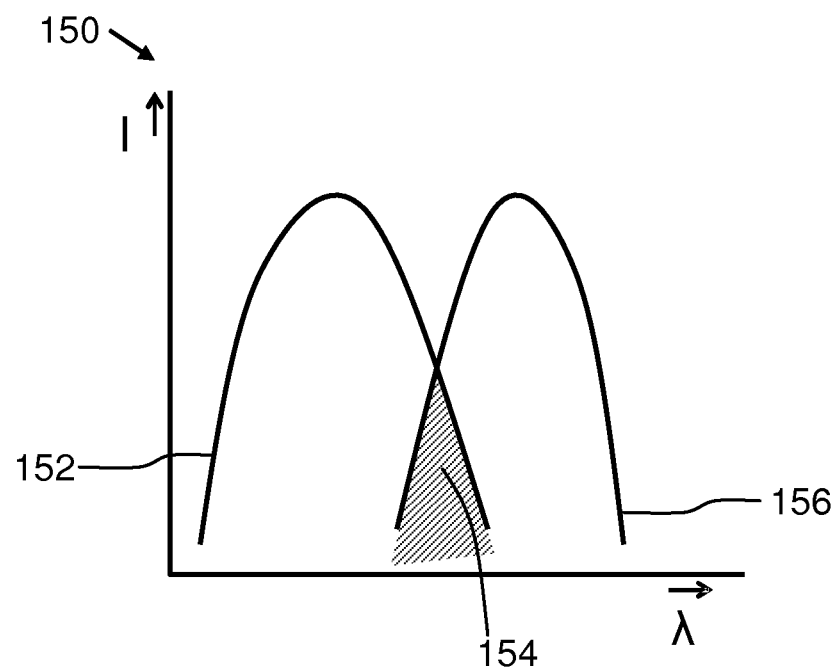
FIG. 1b schematically shows self-absorption by a luminescent material cause by an overlap of the excitation spectrum and the light emission distribution, FIG. 2 schematically shows different embodiments of a luminescent converter according to the first aspect of the invention, FIG. 3a and FIG. 3b schematically show a light emission distribution by a specific luminescent converter receiving light from a blue Light Emitting Diode, FIG. 4 schematically shows three embodiments of a phosphor-enhanced light source according to the second aspect of the invention, and FIG. 5 schematically shows an embodiment of a luminaire according to the third aspect of the invention.

FIGS. 1a and 1b schematically present the phenomena of self-absorption. In FIG. 1a a layer 102 of a matrix polymer is presented which comprises luminescent molecules 104, 108, 110. The size of the luminescent molecules 104, 108, 110 is exaggerated strongly for clarity reasons. The luminescent molecules 104, 108, 110 are of an organic luminescent material. The layer 102, which comprises the luminescent molecules 104, 108, 110, has good light transmission characteristics because the matrix polymer is transparent and does not show absorption of light. Further, the organic luminescent material is relatively transparent. Consequently, only the wavelengths falling within the absorption spectral range of the luminescent material are absorbed by the layer. Light 106 of a predefined color distribution impinges on one side of the layer 102. A portion of the light 106 is transmitted through the layer 102. Another portion of the light 106 is absorbed by the luminescent molecules 110.

In FIG. 1b an excitation spectrum 152 is presented of the luminescent molecules 104, 108, 110. In the chart 150 of FIG. 1b, the x-axis represents the wavelength of light, and the y-axis represents the intensity of the light. Curve 152 represents the absorption spectrum showing at which specific wavelengths of light the luminescent molecules 104, 108, 110 absorb light.

It is shown in FIG. 1a that luminescent molecule 110 absorbs a part of the light 106 and emits light 112 of another color. In FIG. 1b the emission spectrum 156 of the luminescent molecules 104, 108, 110 is presented showing that the light emission may be at a plurality of wavelengths.

The light that is emitted by luminescent molecule 110 is emitted in a plurality of directions. Luminescent molecule 108 receives also a portion of the light that is emitted by luminescent molecule 110. As seen in FIG. 1b the absorption spectrum 152 and the light emissions spectrum 156 partly overlap and as such light that is emitted by the luminescent molecule 110 may be absorbed by luminescent molecule 108. The grey shaded area 154 represents the amount of light that is emitted by the luminescent molecules 104, 110, 108 that is absorbed by other luminescent molecules of the luminescent molecules 104, 110, 108 in a worst case. This phenomenon is called self-absorption.

The amount of self-absorption strongly depends on the concentration of the luminescent molecules 104, 108, 110 in the layer 102 of the matrix polymer, and also depends, but to a lesser extent, on other factors like for example thickness of the layer 102 and a path length of the light within the layer before it escapes the layer. The more molecules are available, or the longer the path length is, the more the phenomenon of self-absorption is detectable. Because the light of the lower part of the light emission spectrum is absorbed, the average wavelength of the color distribution emitted by the layer of luminescent material shifts towards a higher wavelength.

If a yellow-emitting organic luminescent material, which is identified to be stable, is used in combination with a light source that emits blue light, a relatively large amount of yellow-emitting organic luminescent material has to be used because the absorption spectrum of the yellow-emitting organic luminescent material is located to a limited extend in the blue spectrum. Thus, the yellow-emitting organic material is not very sensitive for blue light and a relatively large amount of this material has to be used. Because of self-absorption, the light emission spectrum of the yellow-emitting organic luminescent material shifts towards a larger wavelength (thus, towards the red spectrum). If a blue light source is combined with a yellow-emitting organic luminescent material and a red-emitting organic luminescent material, white light may be generated, however, because of the shift of the light emission of the yellow-emitting organic luminescent material, the color rendering index (CRI) of the white light is not high enough. It is relatively difficult to generate white light with a CRI that is higher than 80. In many applications the CRI has to be higher than 80 to obtain a good color rending.

This insight of the inventors with respect to self-absorption is the basis for the invention. In the invention, an inorganic luminescent material emitting in the green color spectrum is added to a combination of an organic yellow-emitting luminescent material and an organic red-emitting luminescent material, in order to obtain white light with a high enough CRI.

Figure 2:
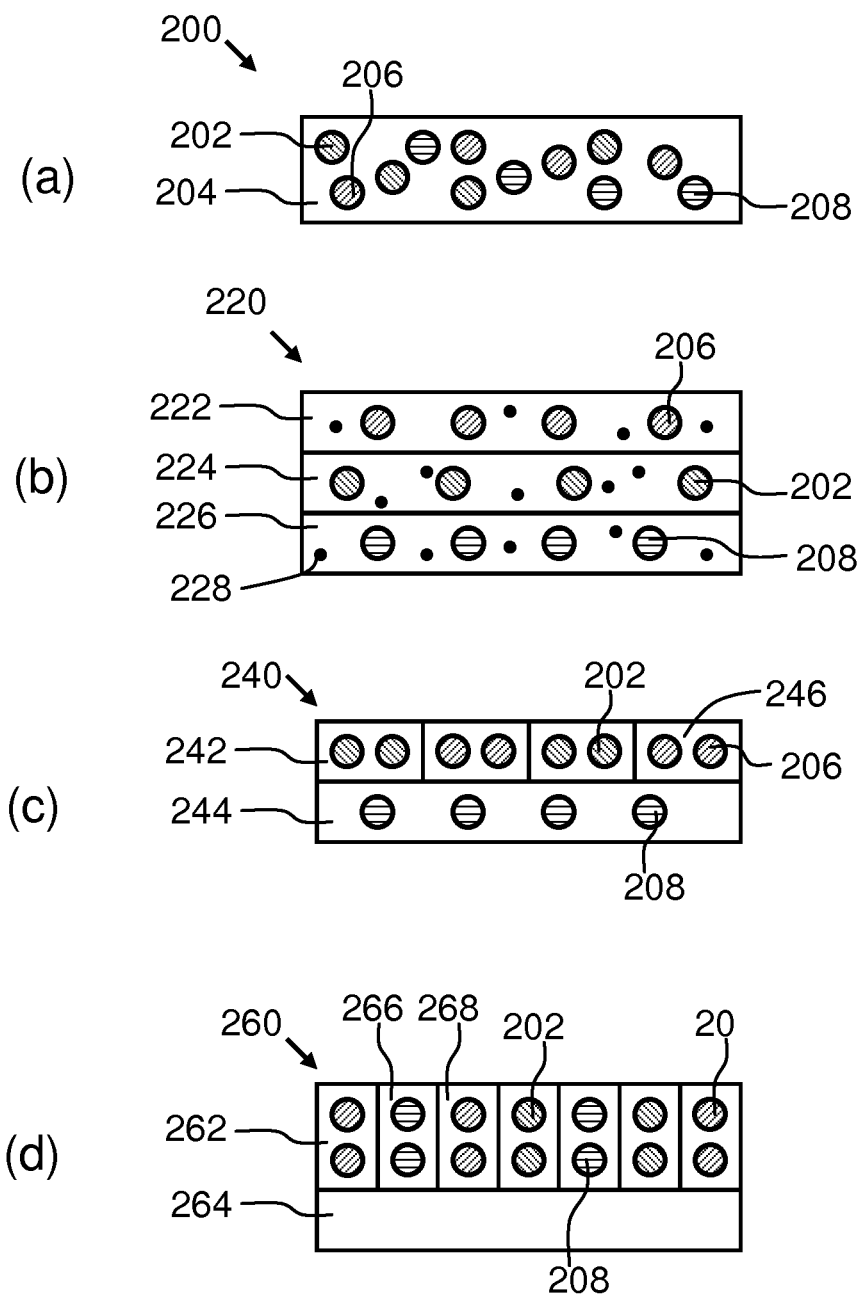

FIG. 2 presents four different embodiments of the luminescent converter according to the first aspect of the invention. The luminescent converter 200 is a layer 204 of a matrix polymer in which three different luminescent materials 202, 206, 208 are available.

The matrix polymer is a polymer in which the luminescent material is dispersed or molecularly dissolved. The polymer matrix may be chosen amongst polymers such as acrylates (for example polymethylmethacrylate), polycarbonate, polystyrene, polyethylene, polyethylene terephtalate, polyethylene naphtalate and their copolymers and blends.

Luminescent material 202 is an organic luminescent material that absorbs light that is emitted by a light source and converts a part of the absorbed light into light of first color distribution which comprises yellow light. In other words, luminescent material 202 is a yellow-emitting organic luminescent material. An example of such a material is the commercially named material Lumogen F Yellow 170, which is sold by BASF. The material is a perylene derivative. A specific class of perylene derivatives that is very stable when being irradiated with blue light comprises compounds according to formula (I) or (II):

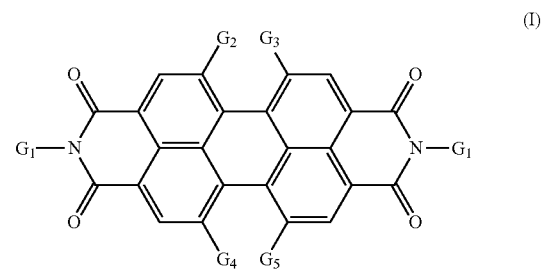
(I)

-continued

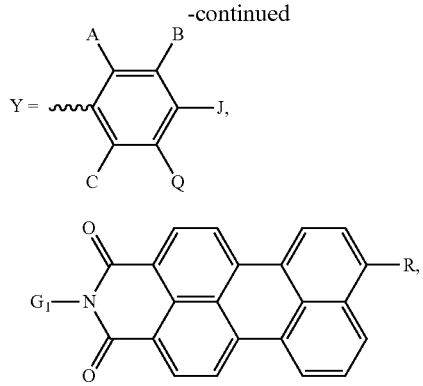

wherein
- $G_1$ is a linear or branched alkyl group or oxygen-containing alkyl group $C_nH_{2n-1}O_m$, n being an integer from 1 to 44 and m<n/2, or $G_1$ is Y;
- each of A, B, C, J and Q independently is hydrogen, isopropyl, t-butyl, fluorine, methoxy, or unsubstituted saturated alkyl $C_nH_{2n+1}$, n being an integer from 1 to 16;
- at least two of $G_2$, $G_3$, $G_4$ and $G_5$ is fluorine, while the remaining of $G_2$, $G_3$, $G_4$ and $G_5$ are independently hydrogen, methoxy, or unsubstituted saturated alkyl group $C_nH_{2n+1}$, n being an integer from 1 to 16,
- R is a linear or branched alkyl group or oxygen-containing alkyl group $C_nH_{2n-1}O_m$, n being an integer from 1 to 44 and m<n/2, or R is hydrogen, isopropyl, t-butyl, fluorine, methoxy or cyano,
- each of A, B, C, J and Q independently is hydrogen, isopropyl, t-butyl, fluorine, methoxy, cyano or unsubstituted saturated alkyl $C_nH_{2n+1}$, n being an integer from 1 to 16.

Two specific examples of the compound according to formula (II) are perylene monoamide compounds according to formula (III) or (IV):

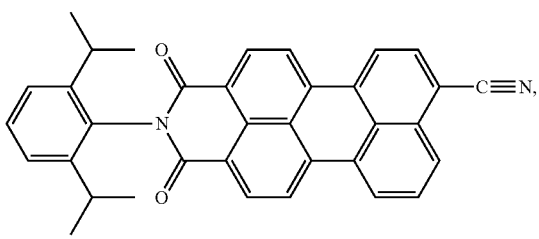

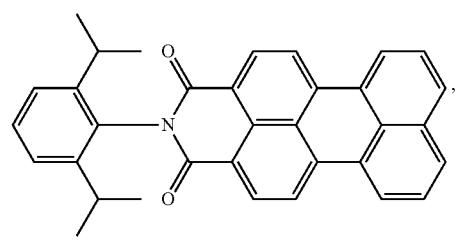

One of the compound according to formula (I) is a fluorine substituted perylene bisamide compounds according to formula (V) or (VI):

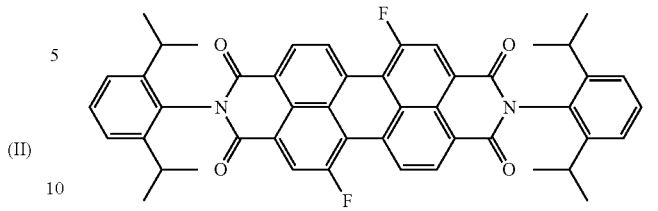

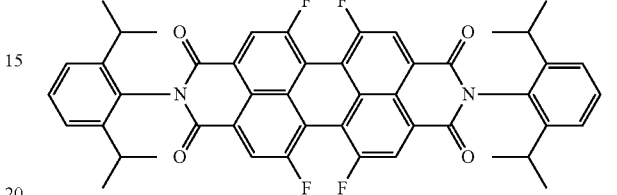

Luminescent material 206 is an inorganic luminescent material that absorbs light that is emitted by a light source and converts a part of the absorbed light into light of a third color distribution which comprises light in the spectral range from 490 nm to 560 nm. In other words, the inorganic luminescent material 206 emits green/yellow light and more specifically in a spectral range in which the yellow-emitting organic luminescent material 202 is subject to self-absorption. An example of such a material is the LuAG 3.5% FT 500 material or a Ce doped YAG.

Luminescent material 208 is an organic luminescent material that absorbs light that is emitted by a light source and converts a part of the absorbed light into light of first color distribution which comprises red light. In other words, luminescent material 208 is a red-emitting organic luminescent material. An example of such a material is the commercially named material Lumogen F Red 305, which is sold by BASF. The material is a perylene derivative.

Because luminescent materials 202, 206, 208 are mixed in one layer, a mix of blue, yellow and red light is transmitted through the luminescent converter 200. The yellow-emitting luminescent material 202 may have a light absorption spectrum which also includes light in a portion of the spectrum range from 490 nm to 560 nm. Consequently, the yellow-emitting luminescent material 202 may also absorb light emitted by the inorganic luminescent material 206. The red-emitting luminescent material 208 may also have an absorption spectrum which includes yellow and/or light in a portion of the spectral range from 490 nm to 560 nm. Consequently, the red-emitting luminescent material 208 may also absorb light emitted by the inorganic luminescent material 206 or by the yellow-emitting luminescent material 202.

The luminescent converter 200 is manufactured as a single layer which comprises the three luminescent materials 202, 206, 208 in a mix. It is relatively easy and cheap to manufacture such a layer because the materials may be mixed with the matrix polymer and subsequently processed into a single layer.

Luminescent converter 220 comprises three layers which each comprise a single luminescent material and which each comprises scattering particles 228 for further scattering light that is transmitted through the luminescent converter. The scattering particles 228 assist in a better light mixing and obtaining a substantially uniform light emission by the luminescent converter 220. The scattering particles may be made of the material $Al_2O_3$ or $TiO_2$.

A first layer 226 of the luminescent converter 220, which faces, in use, towards a light source, comprises the red-emitting organic luminescent material 208. A second layer 224, which is manufactured on top of the first layer 226, comprises the yellow-emitting organic luminescent material 202. The third layer 222, which is manufactured on top of the second layer 224, comprises the green/yellow emitting inorganic luminescent material 206. The third layer is facing away from the light source and is in many applications used as the light emitting surface of a phosphor-enhanced light source comprising the luminescent converter 220.

The configuration of the luminescent converter 220 provides additional design freedom because the order in which the luminescent materials 202, 206, 208 are placed in the stack of layers influences the light emission distribution at the light emitting surface of the luminescent converter 220. For example, in the shown configuration, light emitted by the red-emitting organic luminescent material 208 may partly be absorbed in second layer 224 or in the third layer 222 by the yellow-emitting organic luminescent material 202 or the green/yellow-emitting inorganic luminescent material 206, respectively, to be converted towards yellow and green/yellow light, respectively. It is to be noted that the luminescent materials 202, 206, 208 may also be arranged in another order in the layers 222, 224, 226 to obtain another light emission by the luminescent converter 220. Especially in the presented configuration of the luminescent converter 220 of FIG. 2 the red-emitting organic luminescent material 208 mainly absorbs blue light emitted by the light source.

The luminescent converter 240 comprises a base layer 244 which comprises the red-emitting organic luminescent material 208. On top of the base layer 244 is provided a patterned layer which comprises sub-areas 242, 246. Sub-areas 242 comprise the yellow-emitting organic luminescent material 202 and not the other luminescent materials 206, 208. Sub-areas 246 comprise the green/yellow-emitting inorganic luminescent material 206 and not the other luminescent materials 202, 208. An advantage of the patterned configuration of luminescent converter 240 is that the yellow/green-emitting luminescent material 206 and the yellow-emitting luminescent material 202 do not directly influence each other, and as such the green/yellow light emitted by the yellow/green-emitting luminescent material 206 is not absorbed by the yellow-emitting luminescent material 202 and vice versa. The pattern of the subareas 242, 246 may be obtained by printing the materials of the different subareas on top of the base layer 244.

The luminescent converter 260 comprises a substrate layer 264 that is light transmitting and may be transparent in a practical embodiment. On top of the substrate layer 264 a patterned layer is provided which comprises different sub-areas 262, 266, 268. Each one of the sub-areas 262, 266, 268 comprises only one of the luminescent materials of the group of: the yellow-emitting organic luminescent material 202, the red-emitting organic luminescent material 208 and the green/yellow emitting luminescent material 206. With such a patterning each one of the luminescent materials does influence other luminescent materials to a limited extend if light is received at the side of the substrate layer 264 and has to be emitted at an opposite side of the luminescent converter 260.

Figure 3A:
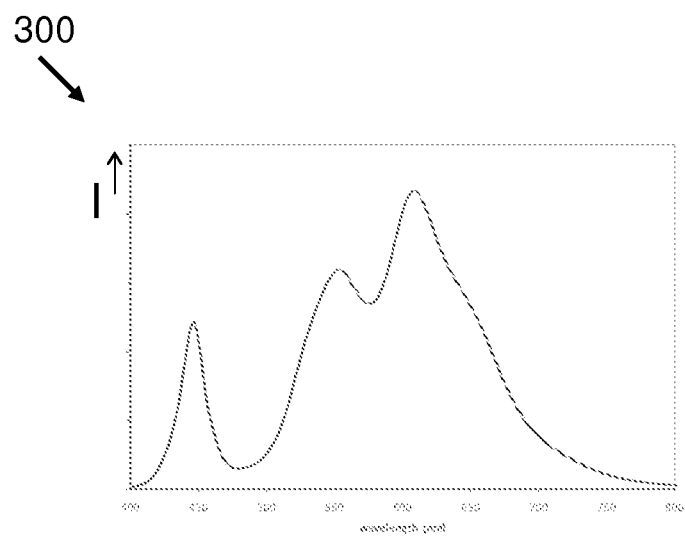

The luminescent material 202, 206, 208 is schematically drawn as spheres in a layer of a specific material. Organic luminescent materials are composed of molecules and as such the spheres schematically represent molecules if the specific luminescent material is an organic luminescent material. The organic molecules are molecularly dissolved in the material which forms the layer, for example, the matrix polymer. The inorganic luminescent material and the scattering particles are particles that are dispersed in the material that forms the layer, which is, for example, a matrix polymer. The inorganic luminescent particles and/or scattering particles have dimensions in the order of 0.1 to 10 micrometer. FIG. 3a presents a light emission spectrum 300 of a phosphor enhanced light source which comprises a blue light emitting diode (LED) and a luminescent converter 220 with the subsequent specifications: the first layer 226 is 54 μm thick and has 0.38 wt % of Lumogen F Red 305, the second layer 224 is 81 μm thick and has 0.1 wt % Lumogen F Yellow 170, and the third layer 222 is 75 μm thick and has 50 wt % LuAG. Each one of the layers has as matrix polymer Polymethylmethacrylate (PMMA). The color temperature of the obtained light emission is 3000K and the CRI is larger than 80. It is seen in FIG. 3a that the phosphor enhanced light source also emits light in the spectral range from 490 to 560 nm which results in the relatively high CRI.

Figure 3B:
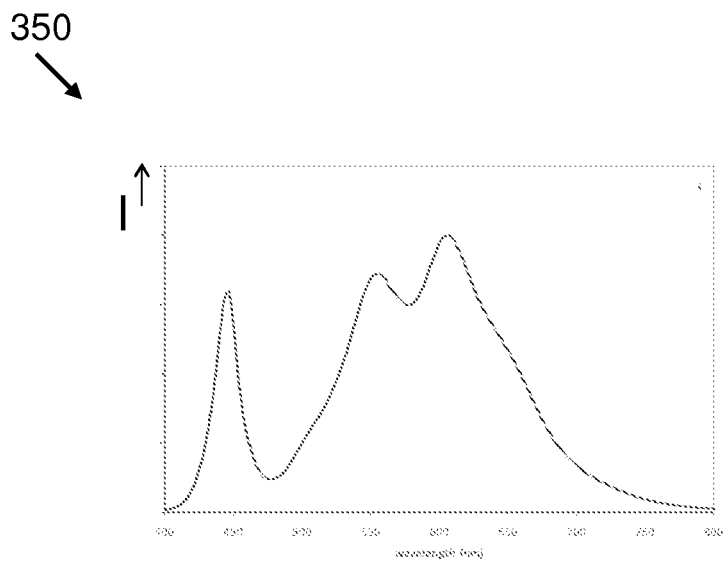

FIG. 3b presents a light emission spectrum 350 of a phosphor enhanced light source which comprises a blue LED and a luminescent converter 240. The luminescent converter has a base layer of PMMA that is 27 μm thick and comprises 0.05 wt % Lumogen F Red 305. The sub-areas 242 with the yellow-emitting organic luminescent material 202 are portions of a PMMA layer that is 210 μm thick and comprises 0.01 wt % Lumogen F Yellow 170 on top of which a scattering layer of 60 μm layer of PMMA is provided that comprises Al2O3 particles. The sub-areas 246 with the green-yellow-emitting inorganic luminescent material 206 are portions of a PMMA layer that is 200 μm thick and comprises 50 wt % LuAG.

Figure 4:
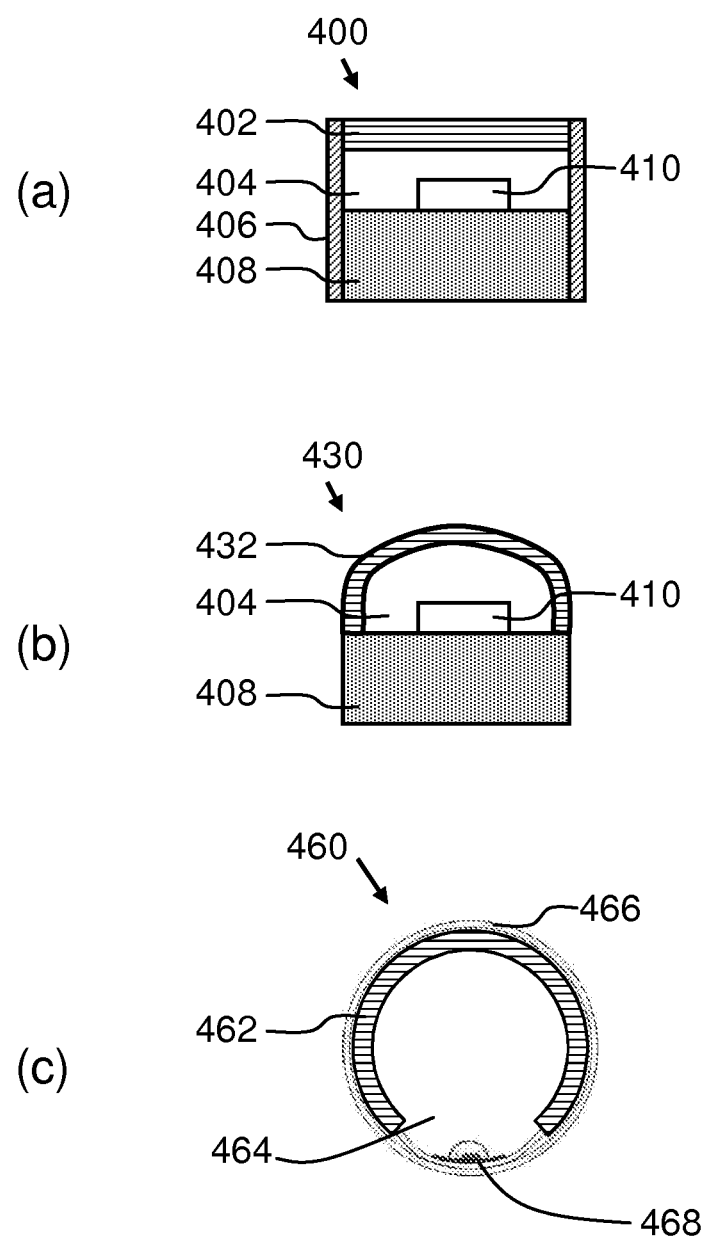

FIG. 4 presents three embodiments of a phosphor enhanced light source 400, 430, 460. Phosphor enhanced light source 400 comprises a base 408 on which a blue emitting LED 410 is provided. A lighting mixing chamber 404 is enclosed by the base 408, walls 406 and a luminescent converter 402 according to the first aspect of the invention. A surface of the base and a surface of the walls facing towards the light mixing chamber 404 may be light reflective. The blue or UV LED 410 emit blue light towards the luminescent converter 402, which converts at least portions of the light emitted by the LED 410 towards yellow, red and green/yellow light. As a consequence, a combination of blue, green, yellow and red light is emitted into the ambient of the phosphor-enhanced light source 400 which has a color point close to a black body line in the a color space (e.g. CIE xyz color space) and which has a CRI larger than 80. The phosphor enhanced light source 400 may have a light emission spectrum according to FIG. 3a if the luminescent converter discussed in the context of FIG. 3a is used and if the LED emits blue light.

Another embodiment of the phosphor-enhanced light source 430 does not comprise walls, but comprises a curved luminescent converter 432 which encloses the light mixing chamber 404.

Phosphor-enhanced light source 460 is a retro-fit fluorescent light tube. A cross-section of the light tube 466 is presented. In the inner chamber 464 of the light tube 466 is provided a blue LED 468. Along the length of the light tube 466 a plurality of such LEDs 468 may be provided. The blue LED 468 emits blue light towards a luminescent converter 462 according to the first aspect of the invention. The luminescent converter 462 is applied to an inner surface of the light tube 466 which faces towards the inner chamber 464 of the light tube 466.

Figure 5:
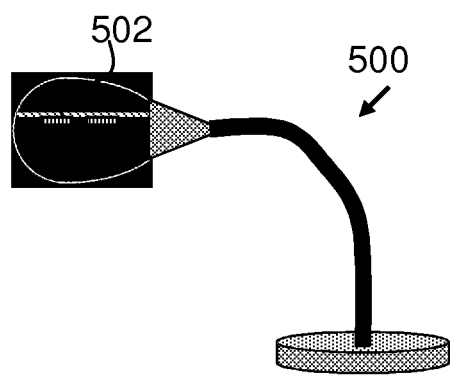

FIG. 5 presents an embodiment of a luminaire 500 according to a third aspect of the invention. The luminaire 500 comprises a luminescent converter according to the first aspect of the invention or comprise a phosphor-enhanced light source 502 according to the second aspect of the invention.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A luminaire comprising:
a luminescent converter for a phosphor-enhanced light source and a light source, the luminescent converter including,
a first organic luminescent material, a second organic luminescent material, and an inorganic luminescent material;
the first organic luminescent material being configured for absorbing a first portion of light emitted by the light source and/or absorbing a portion of light emitted by the second organic luminescent material or the inorganic luminescent material, and the first organic luminescent material being further configured for converting at least a part of the absorbed light into light of a first color distribution, and absorbs a portion of light that is emitted by the first organic luminescent material;
the second organic luminescent material being configured for absorbing a second portion of the light emitted by the light source or absorbing a portion of light emitted by the first organic luminescent material or the inorganic luminescent material, and the second organic luminescent material being further configured for converting at least a part of the absorbed light into light of a second color distribution, at least one of the first organic luminescent material and the second organic luminescent material being subject to self-absorption, respectively, in their absorption of a portion of light at the lower wavelengths of the first color distribution by the first organic luminescent material and resulting in the absorption of a portion of light at the lower wavelengths of the second color distribution by the second organic luminescent material;
the inorganic luminescent material being configured for absorbing a third portion of the light emitted by the light source or absorbing a portion of light emitted by the first organic luminescent material or the second organic luminescent material, and the inorganic luminescent material being further configured for converting at least a part of the absorbed light into a third color distribution for compensating the self-absorption of light by at least one of the first organic luminescent material and the second organic luminescent material, wherein a predetermined amount of the first and/or second organic luminescent materials is selected to provide a light spectrum with a color rendering index (CRI) that is lower than 80 and a predetermined amount of the inorganic luminescent material is selected to provide white light with a CRI that is higher than 80.

2. The luminaire according to claim 1, wherein the first color distribution comprises red light;
the second organic luminescent material is configured for at least one of absorbing a portion of the light emitted by the light source and absorbing a portion of light by the inorganic luminescent material;
the second color distribution comprises yellow light;
the inorganic luminescent material is configured for only absorbing the third portion of the light emitted by the light source; and
the third color distribution comprises light in the spectral range from 490 nm to 560 nm.

3. The luminaire according to claim 1, wherein the second organic luminescent material is a compound according to formula (I) or (II):

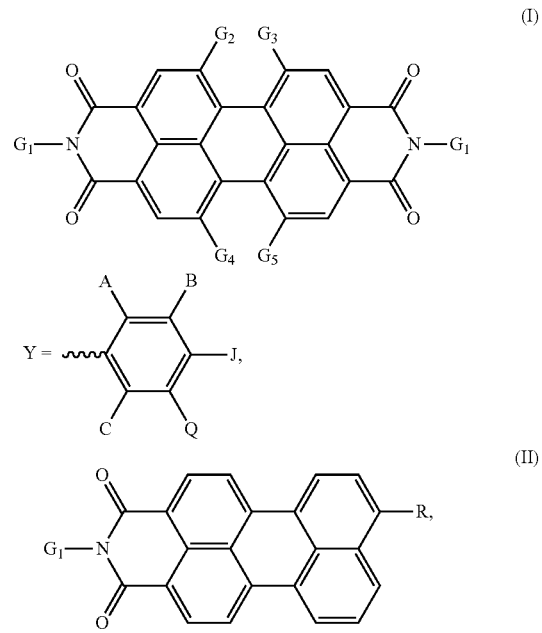

wherein
$G_1$ is a linear or branched alkyl group or oxygen-containing alkyl group $C_nH_{2n-1}O_m$, n being an integer from 1 to 44 and m<n/2, or $G_1$ is Y;
each of A, B, C, J and Q independently is hydrogen, isopropyl, t-butyl, fluorine, methoxy, or unsubstituted saturated alkyl $C_nH_{2n-1}$, n being an integer from 1 to 16;
at least two of $G_2$, $G_3$, $G_4$ and $G_5$ is fluorine, while the remaining of $G_2$, $G_3$, $G_4$ and $G_5$ are independently hydrogen, methoxy, or unsubstituted saturated alkyl group $C_nH_{2n-1}$, n being an integer from 1 to 16;
R is a linear or branched alkyl group or oxygen-containing alkyl group $C_nH_{2n-1}O_m$, n being an integer from 1 to 44 and m<n/2, or R is hydrogen, isopropyl, t-butyl, fluorine, methoxy or cyano;

each of A, B, C, J and Q independently is hydrogen, isopropyl, t-butyl, fluorine, methoxy, cyano or unsubstituted saturated alkyl $C_nH_{2n-1}$, n being an integer from 1 to 16.

4. The luminaire according to claim 3, wherein the second organic luminescent material comprising a perylene monoamide compound according to formula (III) or (IV):

(III)

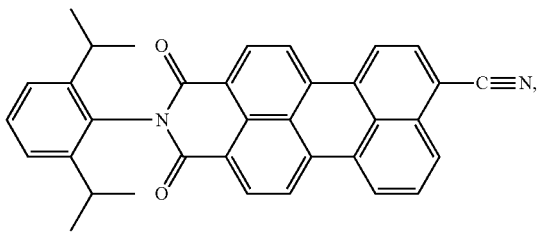

(IV)

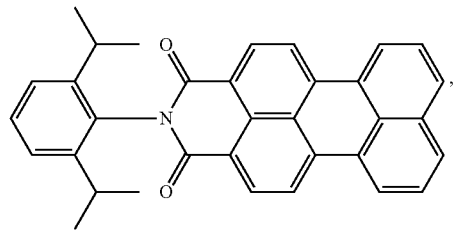

or the second organic luminescent material comprising a fluorine substituted perylene bisamide compound according to formula (V) or (VI):

(V)

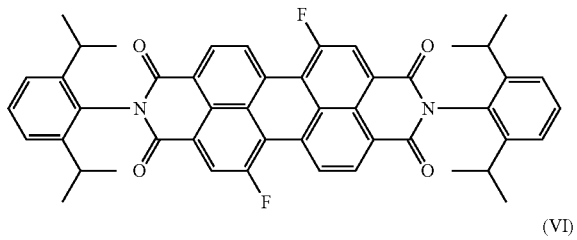

(VI)

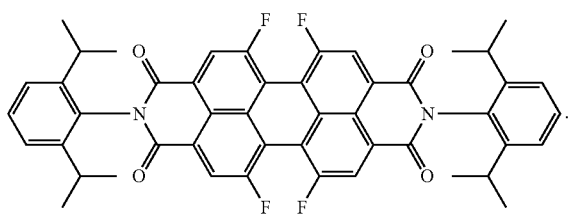

5. The luminaire according to claim 1, wherein the first organic luminescent material comprises a perylene derivative.

6. The luminaire according to claim 1, wherein the inorganic luminescent material comprises at least one of: YAG:Ce or LuAG:Ce.

7. The luminescent converter according to claim 1, comprising in a layer comprising a mix of the first organic luminescent material, the second organic luminescent material, and the inorganic luminescent material.

8. The luminescent converter according to claim 1, comprising a stack of at least three layers, wherein each layer comprises a single one luminescent material of the group of: the first organic luminescent material, the second organic luminescent material, and the inorganic luminescent material.

9. The luminaire according to claim 1, comprising a layer comprising:

a first sub-area comprising a first material from the group of: the first organic luminescent material, the second organic luminescent material, and the inorganic luminescent material; and a second sub-area comprising a second material from the group of: the first organic luminescent material, the second organic luminescent material, and the inorganic luminescent material;

wherein the second material is different than the first material, the first sub-area does not comprise the second material and the second sub-area does not comprise the first material.

10. The luminaire according to claim 9, comprising a further layer comprising a third material from the group of: the first organic luminescent material, the second organic luminescent material, and the inorganic luminescent material wherein the third material being different from the first material and from the second material.

11. The luminaire according to claim 9, wherein the layer comprising a third sub-area comprising a third material from the group of: the first organic luminescent material, the second organic luminescent material, and the inorganic luminescent material; wherein the third material is different than the first material and is different than the second material, the third sub-area does not comprise the first material and does not comprise the second material, the first sub-area and the second sub-area do not comprise the third material.

12. The luminaire according to claim 1, wherein the light source emits blue.

* * * * *